United States Patent [19]

Millett

[11] Patent Number: 5,913,209

[45] Date of Patent: Jun. 15, 1999

[54] FULL TEXT INDEX REFERENCE COMPRESSION

[75] Inventor: Ronald P. Millett, Orem, Utah

[73] Assignee: Novell, Inc., Orem, Utah

[21] Appl. No.: 08/888,968

[22] Filed: Jul. 7, 1997

Related U.S. Application Data

[60] Provisional application No. 60/026,425, Sep. 20, 1996.

[51] Int. Cl.$^6$ ...................................................... G06F 17/30
[52] U.S. Cl. ...................... 707/3; 707/2; 707/6; 707/531; 704/4; 704/7; 704/9
[58] Field of Search .................................... 707/1–6, 531, 707/532, 3; 704/4, 7, 9

[56] References Cited

U.S. PATENT DOCUMENTS

| | | | |
|---|---|---|---|
| 4,318,184 | 3/1982 | Millett et al. ................................ | 707/1 |
| 4,771,385 | 9/1988 | Egami et al. ............................. | 707/532 |
| 4,817,036 | 3/1989 | Millett et al. ................................ | 707/1 |
| 4,972,349 | 11/1990 | Kleinberger ................................. | 707/1 |
| 4,991,087 | 2/1991 | Burkowski et al. ......................... | 707/3 |
| 5,099,426 | 3/1992 | Carlgren et al. ............................ | 704/9 |
| 5,109,433 | 4/1992 | Notenboom ............................. | 382/240 |
| 5,153,831 | 10/1992 | Yianilos .................................... | 707/531 |
| 5,201,048 | 4/1993 | Coulter et al. .............................. | 707/3 |
| 5,251,129 | 10/1993 | Jacobs et al. ............................... | 704/9 |
| 5,297,038 | 3/1994 | Saito ......................................... | 707/1 |
| 5,321,606 | 6/1994 | Kuruma et al. ............................. | 704/9 |
| 5,321,833 | 6/1994 | Chang et al. ............................... | 707/5 |
| 5,375,235 | 12/1994 | Berry et al. ................................ | 707/5 |
| 5,383,121 | 1/1995 | Letkeman .................................. | 704/10 |
| 5,412,807 | 5/1995 | Moreland .................................. | 707/3 |
| 5,701,459 | 12/1997 | Millett et al. ............................... | 707/3 |
| 5,717,912 | 2/1998 | Millett et al. ............................... | 707/3 |
| 5,745,899 | 4/1998 | Burrows .................................. | 707/102 |

OTHER PUBLICATIONS

"Models for Compression in Full–Text Retrieval Systems", Witten et al., Data Compression Conference 1991, IEEE, pp. 23–32.

"Hierarchical Compression Method for Index Lists with Compressed Mode Boolean Operators", Ronald P. Millett, Jul. 26, 1991.

"Coding for Compression in Full–Text Retrieval Systems", Moffat et al., IEEE; Apr. 1992, pp. 72–81.

"Indexing and Compressing Full Text Databases for CD–ROM", Witten et al., Journal of Information Science; Dec. 1990.

*Primary Examiner*—Thomas G. Black
*Assistant Examiner*—Hosain T. Alam
*Attorney, Agent, or Firm*—Dinsmore & Shohl LLP

[57] ABSTRACT

A system and method for compressing a text index. The method includes determining which indexed items have been deleted, and forming a new index which does not contain references to deleted indexed items. Portions of the index are regenerated to eliminate references to deleted indexed items, and a remap structure is created and used during the compression process to remap references from the old portions of the index to the newly generated portions of the index. The method runs relatively quickly, even with a large number of indexed items. The method also works with indexes which use a granularity other than document-level granularity, through the use of a remap array which remaps references to documents as well as references to granules.

16 Claims, 5 Drawing Sheets

FULL TEXT INDEX REFERENCE COMPRESSION

This application claims the benefits of U.S. Provisional application No. 60/026,425 filed Sep. 20, 1996.

TECHNICAL FIELD

The present invention relates generally to the field of text indexers, and is particularly directed to a text index compression system for eliminating references to deleted indexed items.

BACKGROUND OF THE INVENTION

The introduction and increasingly wide usage of computers in the past thirty years has made previously unavailable information increasingly accessible. This "information explosion" has increased exponentially in the past decade with the advent of personal computers (PCs), the large-scale linking of computers via local and wide area networks (LANs and WANs), and related events.

Further, the rapid growth of Internet and intranet technologies has resulted in vast amounts of information which can be accessed on-line. Much of this information is in the form of free format text, such as found in textual documents. One means of searching such information is to navigate through hypertext links using an Internet browser or by traversing the folders of a file system or a document management repository. However, because of the large amount of information, full text indexes of all of the words in the documents are rapidly becoming an essential tool to find needed information.

Indexing is the process of cataloging information in a collection of texts in an efficient and coherent manner so that it can be easily accessed. Most traditional indexing and retrieval schemes are ineffective when dealing with large quantities of variable length document text data.

As PCs have risen from their infancy, when relatively small amounts of data (on the order of kilobytes) were accessible by a single PC, to their current state, in which gigabytes of disparate data are accessible from a single PC, old methods for managing and accessing data are no longer effective.

For a collection of texts, the ability to retrieve data is directly related to the amount and quality of information in the index. For example, the index may contain only the titles of the documents. Or it may contain only certain key terms. The recommended solution is to provide indexing and searching on every word in the collection of texts.

The present invention relates to the class of indexing techniques known as full text indexing. A full text index consists of a word list for a collection of texts which resembles the index of a textbook. It can be viewed as a word list with an ascending order list of numbers associated with each word. Like the index of a book, the numbers refer to the indexing unit, or "granule" (e.g., page 6), where the word occurs in the source text. The core of the problem addressed by full text indexing is how to find documents (or parts thereof) when one does not know by whom they were written, when they were written, or what their contents are, yet one has an idea of the words, phrases, ideas, and possibly the dates involved. Thus, there are generally two search modes contemplated by full text indexers: (1) locate mode, i.e., searches for a specific document known to exist, but about which only fragmentary information is known (e.g., the date or author of the document); and (2) research mode, i.e., searches for documents pertaining to a certain category of information, where it is known whether the documents exist (e.g., documents pertaining to education in the 19th century.

Due to the large quantity of data that must be indexed today, some of the major indexing problems to be addressed are the speed of index creation and access and size of the index. Regarding the speed of index creation, because the data being indexed is constantly changing, a full text indexer must be able to create a new index quickly when data changes. The index must also be quick to locate and access information in the index. Also, since storage space is important and the size of the index is closely related to access speed, it is highly desirable that the index be small relative to the data being indexed.

Limited memory availability when building a full text index quickly creates another problem relating to the relative frequency of words being indexed. The DOS environment, for example, is an especially limited environment for indexing. A word like "the" may occur in almost every indexing unit. A word like "optometrist" might occur in only a few indexing units. If the index is created in a single pass, the word list and the index elements for each word must coexist in the computer's memory. When a new word is encountered, the amount of memory necessary to store the references to that word cannot be known until all documents have been read. A series of small memory allocations would make the index for high frequency words inefficient. Large allocations waste memory.

Full text indexes must be updated as new documents are created and existing documents are changed or deleted, since references to deleted or noncurrent documents can use a significant amount of disk space, and can also decrease the efficiency of retrievals via the full text index. Such space can be reclaimed by reindexing the documents. However, such a reindexing process can be quite time consuming. Another mechanism for reclaiming space utilized by references to deleted documents is by compressing the full text index so that the index contains only active references (nondeleted documents). Since reindexing is generally considerably slower than compressing the index, it is preferable to recover wasted space by compressing the index rather than reindexing the documents.

SUMMARY OF THE INVENTION

It is one object of this invention to provide a method and system for compressing a text index to recover disk space used by references pointing to deleted documents.

It is another object of this invention to provide a text index compression system which executes very quickly.

Additional objects, advantages and other novel features of the invention will be set forth in part in the description that follows and, in part, will become apparent to those skilled in the art upon examination of the invention. The objects and advantages of the invention may be realized and obtained by means of the instrumentalities and combinations particularly pointed out in the appended claims.

To achieve the foregoing and other objects and in accordance with the purposes of the present invention, a method is provided for eliminating references to deleted indexed items in a text index. The method includes determining which item entries of the index refer to deleted indexed items, and forming a remap item list which remaps the item index of item entries which refer to nondeleted indexed items from a first item index in a first item list to a second item index in a second item list. The index includes an alphabetical word list which contains a list of indexed words. Each entry in the alphabetical word list includes a reference to a word index list which contains references to the indexed items which contain that word. The alphabetical word list is processed, and for each word entry, its associated word index list is processed. For each reference in the word index list it is determined if the reference refers to an item entry of a nondeleted indexed item or a deleted indexed item. If the item entry refers to a nondeleted indexed item the remap item list is accessed to obtain the second item entry in the second item list which refers to the nondeleted indexed item. A second word index list is created, and a reference to the second item entry is stored in the second word index list. After all the references in the first word index list are processed, the word entry in the word list is associated with the respective second word index list, discarding the original word index list for that word. A second item list is formed by associating the item entries of the nondeleted items with the respective item index referred to in the remap item list, and at the end of the compression process, the second item list replaces the original item list.

According to another embodiment of this invention, the indexed items include a plurality of granules. A granule generally refers to the finest unit of text in which one wishes to keep track of where a word occurs, for example a granule can refer to a file, a document, a paragraph, or a sentence. The text index can include a granule cross-reference table which includes a plurality of granule entries, each granule entry having a granule index associated therewith, and each granule entry referring to an item entry of an indexed item in the first item list. During the compression process, the remap item list is used to remap the granule index of granule entries which refer to an item entry of a nondeleted indexed item from a first granule index in the original granule cross-reference table to a second granule index in a second granule cross-reference table. At the end of the compression process, the second granule cross-reference table replaces the original granule cross-reference table.

According to another embodiment of this invention, the remap item list includes remap entries which remap a range of one or more contiguous item entries, and the granule entries associated therewith. Each remap entry refers to a range of nondeleted indexed items or a range of deleted indexed items.

Still other objects of the present invention will become apparent to those skilled in the art from the following description, wherein there is shown and described a preferred embodiment of this invention, simply by way of illustration, of one of the best modes contemplated for carrying out the invention. As will be realized, the invention is capable of other different obvious aspects all without departing from the invention. Accordingly, the drawings and description will be regarded as illustrative in nature and not as restrictive.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DESCRIPTION OF THE PREFERRED EMBODIMENTS

The method and system for index reference compression (also referred to as a 'squeeze' operation) described herein has utility in the compression of a variety of text indexes. A method for the creation and generation of one such text index will be described below with reference to a set of documents. The documents may contain alphanumeric text of any language and are limited in number only by the available disk storage. The text index discussed herein may be implemented on virtually any digital computer system.

1. GENERATION OF THE TEXT INDEX

The method disclosed reads each word of the selected documents and for each unique word in the set of documents, the index records the "granules" in which the word is found. A granule may be any grouping of words within a document or set of documents, such as a sentence, paragraph, page number, section, chapter, document, etc. In general, the method remains the same regardless of the granule size chosen.

Figure 1:
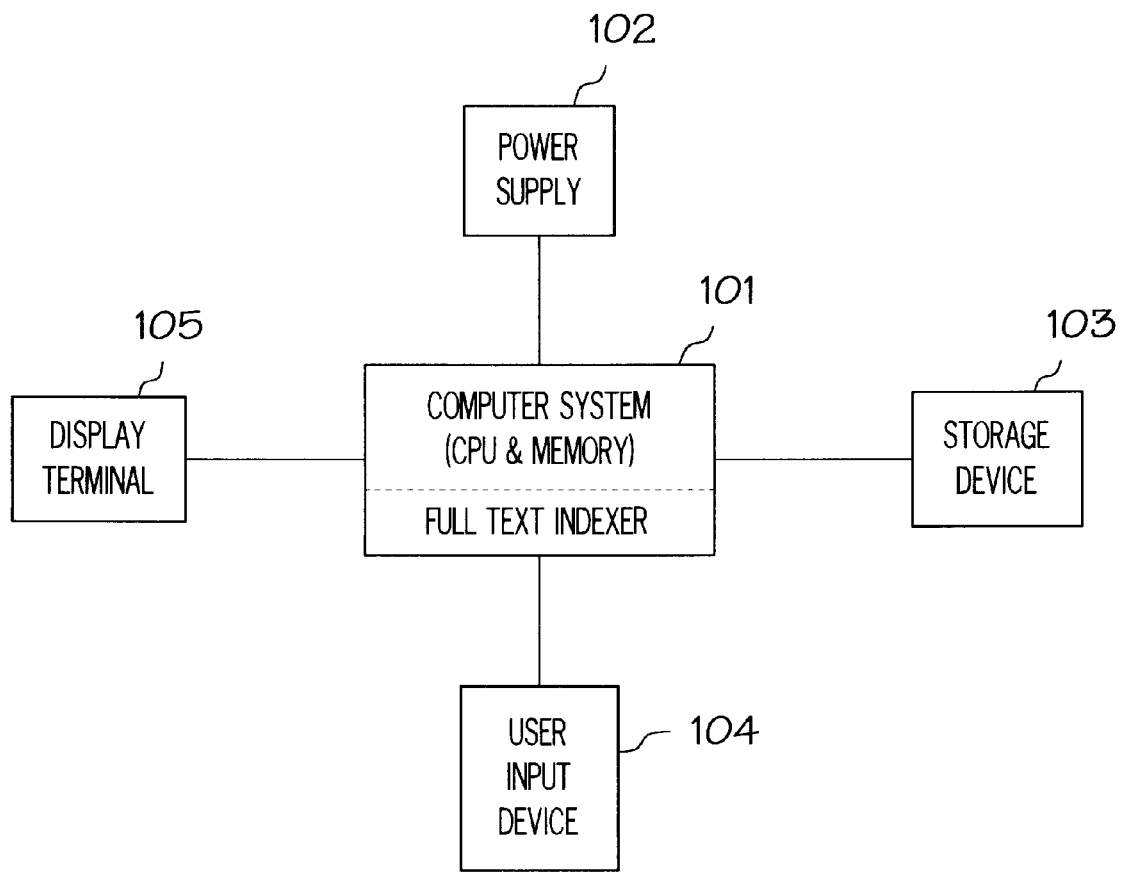
FIG. 1 is a block diagram of the computer system in which the present invention can be practiced.

Referring to FIG. 1, a block diagram schematically illustrating the computer system is disclosed. The system includes CPU and a memory (101) in which the full text indexer is executed, power supply (102), user input device (103), storage device (104), and display terminal (105).

Figure 2:
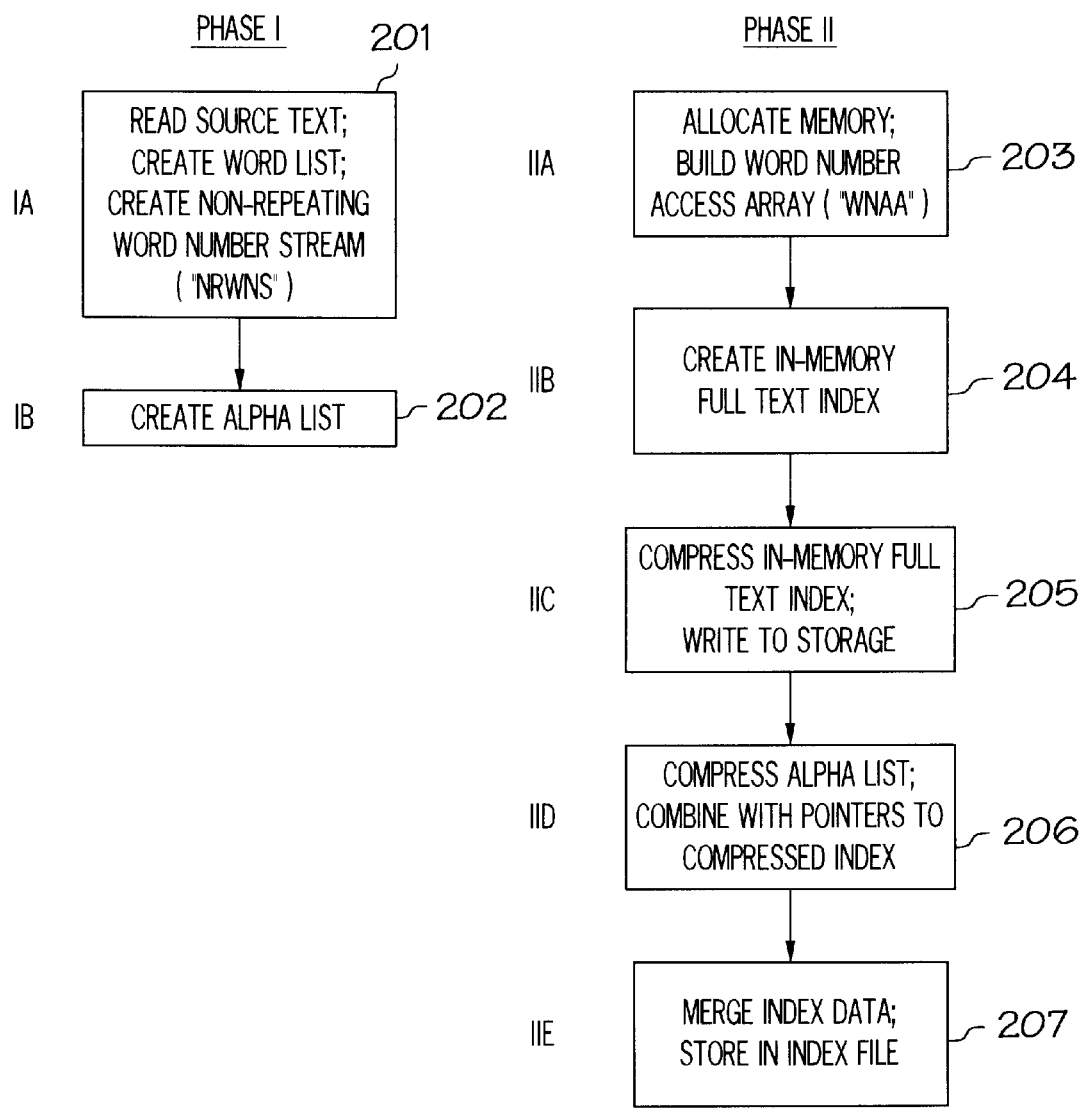
FIG. 2 is a summary flowchart of the method for rapid full text indexing.

Referring to FIG. 2, a summary flow diagram of the method is disclosed. In Phase IA (201), a selected set of documents are read sequentially from which an in-memory Word List (also called Word List symbol table) and a Non-Repeating Word Number Stream ("NRWNS") are created. A granule cross-reference file is also maintained for recording the document in which each granule occurs. In Phase IB (202), an alphabetized list (the Alpha List) is created from the in-memory Word List and stored in a temporary file. In Phase II, the data compiled in Phase I is processed and merged into a full text index and written to permanent storage. In Phase IIA (203), memory is allocated in a highly efficient manner based on word frequency data gathered in Phase I. A Word Number Access Array ("WNAA") is built which references data necessary to build the final full text index. In Phase IIB (204), an uncompressed in-memory full text index is constructed by sequentially reading the NRWNS and merging the data in the WNAA into the index. In Phase IIC (205), the uncompressed in-memory full text index and WNAA reference list data are compressed into a final fill text index and written to storage. Each word's reference list in the WNAA can be compressed using a combination of four compression methods—Run Length Encoding, Delta Encoding, Absolute Element Reference, or Bit String Representation. In Phase IID (206), the Alpha List is compressed and each word is combined with a pointer to the final compressed index. Finally, in Phase IIE (207), the index and related data is merged into a single index file.

The method can be summarized by the following pseudocode:

1. Initialize Indexer. Open temporary files.
2. Get next file from the list to index.
3. If no more files or low memory condition (insufficient memory available) then Go to 8.
4. Open the file for processing.
5. Scan through the file (Phase IA). Create the NRWNS file, granularity cross reference file, and the hash-tree in-memory Word List.
6. Close the file.
7. Go to 2.
8. Output the hash-tree in-memory Word List to a file in alpha order (Alpha List) (Phase IB).
9. Allocate memory for uncompressed merged index using the Alpha List (Phase IIA). For low memory machines, portions of the word list are marked for merging the uncompressed index in incremental passes.
10. Read the NRWNS and make the uncompressed in-memory index accessed by the word number (Phase IIB). Low memory machines require multiple passes through steps 10 and 11.
11. Compress the index to a disk file while retaining index cross-reference information in memory (Phase IIC).
12. Create a compressed version of the Alpha List adding pointers to the index and its length (Phase IID).
13. Merge the file, path, and granule cross reference information with the compressed Word List and the index into the final index file (Phase IIE).
14. Finish indexer and close files.

INDEX CREATION

I. Phase I

A. Index a File

First, the selected files are read sequentially, word by word, and two primary data structures are built: the in-memory Word List and the NRWNS. The Word List contains information about each unique word found in the set of selected files. The NRWNS is a temporary data file in which is stored sequentially a representation of the stream of words found in the set of documents, each word being represented by a unique word number. Each unique word in the set of files is assigned a word number sequentially according to the order in which the word first occurs in a file.

Figure 3:
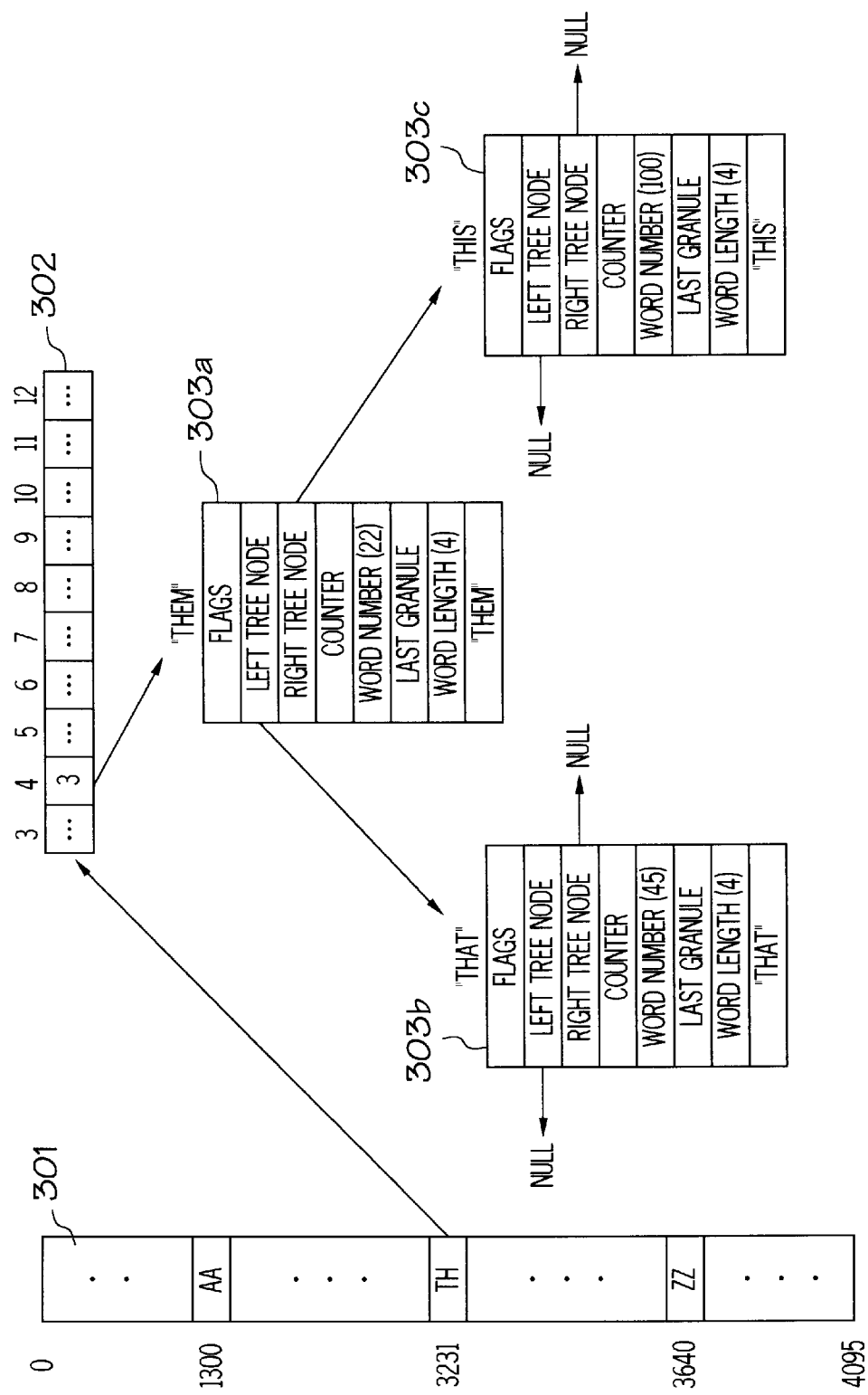
FIG. 3 is a representative portion of an in-memory word list data structure.

The logical structure of the Word List is a key factor for the speed with which the index is created. Each word is stored as a node of a binary tree and is accessed in the Word List based on its first two letters (e.g., "TH" for "THIS" or "THOSE"). Referring to FIG. 3, the Word List comprises a 4096 element table (301). Each element ("hash bucket") of the table is accessed by a unique hash number representing the first two characters of the word (e.g., "TH"). In the preferred embodiment, each character is assigned a value from 0–63 and the hash number is determined according to a hash function wherein the assigned value of the first character is multiplied by 64 and added to the assigned value of the second character (e.g., where "T" has assigned value 50 and "H" has assigned value 31, "TH" hashes to (50*64)+31=3231). In single character words, the second character is assigned value "0". (The 64 characters represented include the letters a . . . z, numbers 0 . . . 9, and international characters.)

Each hash bucket points to (i.e., contains the address of) a separate table (302) having ten elements (or which is NULL). Each element ("sub-bucket") of the ten element table represents a group of words beginning with the particular two characters represented by the unique hash number. Each of the ten elements contains a pointer to a separate binary tree (303a) of words and a count of how many words are in the tree. The first sub-bucket contains words of three characters or less. The second sub-bucket contains words of four characters (e.g., THis, THat). The third sub-bucket contains words of five characters and so on until the tenth sub-bucket which contains words of 12 characters or more. Thus, the data structure potentially contains 40,960 binary trees associated with the Word List.

Each node (303a, 303b, 303c) of a binary tree in the Word List is composed of eight fields:
 (1) flags for memory control;
 (2) a pointer to the left tree node (or NULL);
 (3) a pointer to the right tree node (or NULL);
 (4) a counter for the number of granules (units) in which the word occurs;
 (5) the unique Word Number associated with the word (assigned sequentially);
 (6) the last granule (unit) in which the word was found;
 (7) the length of the word; and
 (8) the actual characters of the word.

The memory for each word can be allocated as a piece of a larger memory allocation unit to avoid wasting overhead space of the allocation system.

The NRWNS is comprised of a series of word numbers demarcated by granule boundary indicators, in the following form:

[100 45 22<New Granule>201 34 . .. <New Granule>. . . 50 20 1 . . . ], where numbers represent the word numbers assigned to the respective words and <New Granule> represents granule demarcation. The purpose of the NRWNS is to track the granules in which a word occurs, not the total number of occurrences of the word. Thus, the word number for a particular word will only be stored in the NRWNS once for each granule in which it appears. For example, if there are 25 occurrences of the word "the" in the third granule, the word number for "the" will be placed into the NRWNS only once, i.e., upon its first occurrence in the granule. Because the NRWNS is built sequentially as the documents are scanned, it contains a sequential list of the words as they occur in the set of documents.

The Word List is complete after each of the selected documents has been scanned and added to the list.

This step of the preferred embodiment is described in detail by the following pseudocode:
 1. Get a word or granule boundary from the file.
 When end of file is reached go to 4.
 2. If a granule boundary variable was returned then
  2.1 Increment CurrentGranuleNumber.
  2.2 Output new granule marker to NRWNS.
  2.3 Go to 1.
 3. A word was returned. Now process it.
  3.1 Make hash number based on first two characters of word that preserves sort order (AA before AB) between 0 and 4096. Select this as the main hash bucket.
  3.2 Make another hash number based on length of word (0–9).
  3.3 If no binary tree exists for this hash into the 40,960 possible buckets, create a bucket and create a binary tree. If a low memory condition exists then go to 5, else go to 3.6.1

3.4 Otherwise, if the binary tree exists, then traverse the binary tree comparing the new word to the words in the tree.
3.5 If a match is found (old word), then
  3.5.1 If CurrentGranuleNumber>LastUnitCounted for this entry then
    3.5.1.1 If Low Memory Condition then go to 5.
    3.5.1.2 Output this word's word number to the NRWNS. Increment TotalNRRefs.
    3.5.1.3 Set LastUnitCounted for this word to CurrentGranuleNumber.
    3.5.1.4 Increment frequency count for this word.
  3.5.2 Go to 1.
3.6 If a match is not found, then
  3.6.1 If Low Memory Condition then go to 5.
  3.6.2 Add this new word to the binary tree.
  3.6.3 Give this word the next available word number.
  3.6.4 Output this word number to the NRWNS. Increment TotalNRRefs.
  3.6.5 Set LastUnitCounted for this word to CurrentGranuleNumber.
  3.6.6 Increment word number variable.
  3.6.7 go to 1.
4. Output end of file granule marker to NRWNS. Go to 6.
5. Save address of the current word in the current document for restart.
6. End Phase IA.

B. Create Alpha List and Output Disk

Second, a temporary alphabetized list file (the Alpha List) is created from the in-memory Word List. Referring to Table 1, a partial sample list, for each unique word the list contains the word, the word number, and the number of granules in which the word occurred (frequency count).

TABLE 1

| WORD | WORD # | FREQUENCY COUNT |
|---|---|---|
| Alice | 3 | 10 |
| In | 1 | 125 |
| Wonderland | 5 | 7 |

This Alpha List is created by visiting each hash bucket in the 4096 element table. Within each hash bucket, the binary trees under the sub-buckets are traversed and merged into alphabetical order. The information for each word is then written to the Alpha List file as the Word List is traversed.

This phase of the preferred embodiment is described in detail by the following pseudocode:

1. Loop through all 4096 main hash buckets. When done, Go to 10.
2. If bucket is empty then go to 1.
3. Loop through the 10 hash buckets for this main bucket. When done, Go to 7.
4. If bucket is empty then go to 3.
5. Traverse this binary tree and put pointers to word structures in an array.
6. Go to 3.
7. Merge the ten possible lists for the different length words for this main hash bucket in alphabetic order (e.g. that, the, them . . . )
8. Write the word entries to storage including the frequency count, the word number, and the word. While traversing each entry keep statistics from the frequency counts to calculate memory needs for Phase II processing.
9. Go to 1.
10. Free up all memory used by the hash-tree word list structures.
11. Save important information for Phase II, including number of granules in this indexing session, the number of unique words, Phase II memory requirements, index creation control parameters (e.g., granule size), and number of non-repeating references to read in Phase II.

II. Phase II Index Generation

The final full text index is generated in the second phase as follows.

A. Memory Allocation

The first step to creating the full text index is to allocate memory necessary to build the index. In this step, memory is allocated for an in-memory uncompressed index that will be used to create the final compressed full text index. The primary dynamic data structure used in building the index, and thereby affecting memory allocation, is the WNAA.

TABLE 2

| WORD | WORD# | NEXT | FLAG | REFS | BYTES | MEM | INDEX POINTER |
|---|---|---|---|---|---|---|---|
| NOW | 1 | 12 | 1 | 5 | 2 | 53F5:0004 | 13 |
| IS | 2 | 8 | 1 | 5 | 2 | 53F5:0000 | 10 |
| THE | 3 | 13 | 1 | 7 | 1 | 53F5:0008 | 17 |
| TIME | 4 | 9 | 1 | 4 | 1 | 53F5:000C | 20 |
| FOR | 5 | 7 | 1 | 4 | 2 | 53F4:000C | 6 |
| ALL | 6 | 10 | 1 | 4 | 1 | 53F4:0006 | 2 |
| GOOD | 7 | 2 | 1 | 4 | 2 | 53F4:000E | 8 |
| MEN | 8 | 1 | 1 | 4 | 1 | 53F5:0002 | 12 |
| TO | 9 | 0 | 1 | 4 | 2 | 53F5:000E | 21 |
| COME | 10 | 14 | 1 | 4 | 1 | 53F4:0008 | 3 |
| AID | 11 | 6 | 1 | 4 | 2 | 53F4:0004 | 0 |
| OF | 12 | 3 | 1 | 5 | 2 | 53F5:0006 | 15 |
| THEIR | 13 | 4 | 1 | 5 | 2 | 53F5:000A | 18 |
| COUNTRY | 14 | 5 | 1 | 5 | 2 | 53F4:000A | 4 |

Referring to Table 2, the WNAA contains an entry for each unique word. Each entry includes a field for index type (Flag), pass number, alphabetic order (Next), the total number of index references for the word (Refs), the size (in bytes) of the compressed index for this word, and a pointer to the memory location (and later the disk location) of the index for the particular word (the index is first located in memory and later saved in storage after compression). In Table 2, sample WNAA data is shown for a document containing the sentence "Now is the time for all good men to come to the aid of their country." (The pass number (not shown) for each entry is 1).

The amount of memory allocated is determined by the number of granules processed, the number of unique words, and the frequency of occurrence of each word. First, the total number of granules processed is used to determine the size in bytes of the number necessary to list the granule number. If the number of granules is less than 65,536, two bytes of memory are allocated for referencing granule numbers. If there are more than 65,536 granules, four bytes are assigned. For each word in the WNAA, a block of memory is allocated according to the format in which the list of granule references for that word will be stored. The format may be either "full bit string" or a "list representation." In a full bit string representation, each bit in the bit string represents a granule, with the bit set to '1' if the word is found in the granule and '0' otherwise. For example, 15 bits are required to represent 15 granules. Since memory is allocated in bytes, 2 bytes (16 bits) would be required for a full bit string representation. If the word occurred in granules 2, 5, 11 and 14, the full bit string representation for the word would be:

0100100000100100

This list representation is composed of a sequential list of the granule numbers in which the word is found. Each number in the list is either 2 or 4 bytes, depending upon the total number of granules processed, as previously discussed. Thus, in the example, assuming each granule number is represented in 2 bytes, the list representation would require 8 bytes (2 bytes for each of the 4 granule numbers—2, 5, 11, and 14).

Memory is then allocated for an index entry for each word in the Alpha List created in Phase IB. The format used is determined by comparing the number of bytes necessary for a full bit string representation (i.e., the bit string threshold), with the number of bytes required for a list representation. The format requiring the least number of bytes is used. Thus, in the example, a full bit string representation would be used.

The Memory Allocation step of the preferred embodiment is described in detail by the following pseudocode:

1. Remember memory limits for this platform, if any, from Phase I processing.
2. BitStringSize (bit string vs. reference list representation)=(number of granules processed for this session)/8+1.
3. If number of granules processed<64K then ListElementSize=2 bytes.
4. If number of granules processed≧64K then ListElementSize=4 bytes.
5. BitStringThreshold=(BitStringSize+1)/ListElementSize.
6. Allocate a table entry for each unique word (WNAA). The structure incudes controls, this word's reference count in the index, number of bytes for index piece, and a pointer to the memory location for the uncompressed index for this word number.
7. Allocate memory for uncompressed index calculated during Phase IB processing. If it does not fit into memory, allocate all memory, then take several passes on phase IIB and IIC. PassNumber=1.
8. Read a word from alphabetic word list. When done, Go to 17.
9. Using the Word Number from Phase I, index into the WNAA.
    9.1 If first word then
        9.1.1 Set HeadWord=WNAAIndexNo (WNAA index number)
    9.2 Else
        9.2.1 Set Controls.AlphaNext=WNAAIndexNo
        9.2.2 Set WNAALastIndexNo=WNAAIndexNo
10. If Frequency Count*ListElementSize is above BitStringThreshold then
    10.1 Memory type=Full Bit String Representation.
    10.2 BytesToAllocate=BitStringSize.
11. Else
    11.1 Memory type=List Representation
    11.2 BytesToAllocate= FrequencyCount*ListElementSize.
12. If allocation will not fit in the memory block then
    12.1 Increment PassNumber.
    12.2 Initialize pointer to the start of the block and reinitialize the memory in the block.
13. Allocate BytesToAllocate bytes of memory in block
14. Increment pointer in block, decrement free bytes in block.
15. Fill this word's entry in the WNAA with values including memory pointer, Memory type, and PassNumber (in controls). The counter of the references is set initially to zero.
16. Get next word; go to 8.
17. PassLimit=PassNumber.

B. Merge in Uncompressed Index

In Phase IIB, the in-memory index is built by reading through the NRWNS file and recording the occurrences in the index for each word in the stream. A granule counter (GranuleNumber) is incremented each time a granule boundary indicator is encountered in the NRWNS and thereby keeps track of the current granule number. Thus, for each word number in the NRWNS beginning with the first word number, the index is updated to reflect the granule number where the word is found. This is done by accessing the memory location for the index for the particular word number via the index pointer in the WNAA entry for that word number. The occurrence of that word number in the current granule is then stored in the index.

The manner in which the occurrence is recorded in the index depends on the format of the index—either full bit string or list representation (as determined in the Memory Allocation step). If the WNAA control indicates that the index for that word is stored in full bit string format, then the granule number(th) bit offset in the index for this word is set (to '1'). For example, if the word is found in the tenth granule, the tenth bit in the bit string is set. If the WNAA control indicates that the index for that word is stored in list representation format, then the granule number is stored in the next available (2 or 4 byte) location in the index for that word. The ReferenceCount field in the WNAA entry for that word number keeps track of the number of times the word number has been referenced.

The in-memory index is complete after the entire NRWNS has been processed.

This step of the preferred embodiment is described in detail by the following pseudocode:

1. GranuleNumber=1; PassNumber=1.
2. Read entry from NRWNS file. When done, Go to 5.
3. If entry is a granule indicator then
   3.1. Increment GranuleNumber.
   3.2. Go to 2.
4. If entry is a word number then
   4.1. Access this word's structure in the WNAA.
   4.2. If PassNumber <>Passlimit && PassNumber (in Controls) for this word <>PassNumber then Go to 2 (ignore this word number on this pass).
   4.3. If word flags indicate bit string representation then
      4.3.1. Set the GranuleNumber(th) bit offset from the index pointer for this word.
      4.3.2. Go to 2.
   4.4. If word flags indicate list representation then
      4.4.1. If ListElementSize==2 then Offset=ReferenceCount (for this word)* 2.
      4.4.2. Else Offset=ReferenceCount*4.
      4.4.3. Add 2 or 4 byte reference depending on ListElementSize at Offset from the index pointer for this word.
      4.4.4. Go to 2.
5. End of Phase IIB.

C. Compress Index

In this step of the preferred embodiment, a compressed index is created from the WNAA and written to permanent storage. Each word's reference list can be compressed into the index by using a combination of four compression techniques: (1) run length encoding "RLE"); (2) bit string fragment encoding; (3) delta encoding; and (4) absolute element reference. The method uses a combination of the four techniques to compress each word reference list so as to maximize the overall compression ratio achieved (i.e., to minimize the size of the compressed file). Thus, the compression ratio is the ratio of the size of the target file (i.e., the file being compressed) as compared to the size of the compressed file (e.g., 4:1).

D. Compress Word List

This step of the method creates an alphabetically ordered temporary file of index data for each word by reading sequentially through the Alpha List, retrieving index data for each word from the WNAA, and storing the data in a temporary file. For each word in the list, the index data is compressed into a variable length record comprising:

the length of the record (1 byte);

the number of index references (1–4 bytes);

the offset for this index within the temporary file (1–4 bytes);

the number of bytes in the index for this word (1–4 bytes);

the left end compaction count (1 byte); and the word itself (1–N bytes).

The left end compaction count field contains the number of consecutive letters, reading left to right, that the current word has in common with the previous word (e.g., where "the" precedes "them", the count would be 3). Every 10K bytes, the currently processed word is stored in order to create a high level index.

The Compress Word List step is described in detail by the following pseudocode:

1. Get word from the alphabetic word list file created in Phase IB. When done, Go to 7.
2. Use the word number to index into the WNAA to get the length and offset of the index for this word.
3. Compress into variable length record as follows:
   Length of record 1 byte
   Number of references in Index 1–4 bytes
   Offset for index in packet 1–4 bytes
   Number of bytes in this index 1–4 bytes
   Left end compaction count 1 byte (from previous word)
   Word itself without a null 1–N bytes
   (The variable length format takes a long word from high to low bytes with the two highest bits indicating how many bytes should be used:
   00=1 byte, 01=2 bytes, 10=3 bytes, 11=4 bytes).
4. Write this record out to a temporary file.
5. Keep a word every 10k bytes for high level word index. Reinitialize front end compaction for a word that has the high level index.
6. Next word. Go to 1.
7. End of Phase IID.

E. Merge Final Index

In the final step, the index data created in the previous steps is written to a permanent index file. The final index contains seven packets of data plus an optional packet. Referring to Table 3, sample packet data of the permanent index file is shown.

TABLE 3

| | | | | |
|---|---|---|---|---|
| PACKET 1. | NumberUniqueWords | = 2000 | | |
| | PathRecSize | = 88 bytes | | |
| | NumGranules | = 100 | | |
| | FileRecSize | = 25 Kbytes | | |
| | NumPasses | = 2 | | |
| | NumFiles | = 10 | | |
| PACKET 2. | aaron | offset 0 | | |
| | mulek | offset 1095 | | |
| PACKET 3. | c:\research\info\general\*.* | | | |
| | c:\research\testing\*.doc | | | |
| PACKET 4. | histalma.hst 10/10/90 | 4:12 p. | 49,425 bytes | pathrec = 0 |
| | — — | — | — | — |
| | — — | — | — | — |
| | aletsumm.hst 4/1/85 | 12:00 a. | 1,954 bytes | pathrec = 1 |
| PACKET 5. | file = 1, offset = 0 | item offset = 0 | | |
| | file = 1, offset = 245 | item offset = 0 | | |
| | file = 1, offset = 2481 | item offset = 0 | | |
| | — — | | | |

TABLE 3-continued

|          |               |               |                 |              |
|----------|---------------|---------------|-----------------|--------------|
|          | file = 2,     | offset = 0    | item offset = 100 |            |
|          | —             | —             |                 |              |
|          | —             | —             |                 |              |
|          | file = 10,    | offset = 598  | item offset = 2530 |           |
| PACKET 6.| aaron         | numrefs = 5   | offset = 0      | indexsize = 5|
|          | —             | —             | —               | —            |
|          | mulek         | numrefs = 100 | offset = 5000   | indexsize = 40|
| PACKET 7.| Compressed Full Text Index |  |        |              |
| PACKET 8.| "Delete List" of Deleted Documents (Incremental merge only) | | | |

With respect to Table 3, packet 1 contains general information about the index, including the total number of words in the index, the path size, and the index file name size.

Packet 2 contains a high level index comprising the word entry and offset for every 10K bytes of the index of packet 6.

Packet 3 contains group information. As shown in Table 3, a group can be equivalent to a directory path. The group information is used to locate the indexed items maintained in packet 4.

Packet 4 includes records (item entries) which refer to indexed items. With respect to the embodiment shown in Table 3, an indexed item is equivalent to a file, or document, however indexed items can be entities other than files.

Packet 5 contains granule cross-reference records pointing to an item number and a byte granule offset within the item (as identified in packet 4)for identifying the location of each granule boundary. This information is necessary for indexes that are not of "document level" granularity. A 'granule' generally refers to the finest unit of text in which one wishes to keep track of where a word occurs, for example a granule can refer to a file, a paragraph, or a sentence. The granule offset is used for indexes that utilize granularity other than "document level" granularity. For example, if the granularity is paragraph level or sentence level granularity, the granule offset reflects the offset of the granule within a particular item listed in packet 4. Packet 5 can also include an item offset, to enable the item records (sometimes referred to as 'item entries') of packet 4 to be variable length.

Packet 6 contains an alphabetical list of the indexed words ('alphabetical word list' or 'indexed word list'), and various fields of information such as the 'num refs' field which maintains a count of the number of times the particular word occurs in the indexed items, and the 'offset' field which is an offset into packet 7, as described in more detail below, where the particular index for the respective word can be found.

Packet 7 contains the full text index created in Phase IIB and IIC. The full text index can comprise a plurality of indexes (referred to as 'word reference lists' or 'granule indexes'), each index referencing the particular granules in which a particular word can be located. For example, with respect to the word 'aaron' in packet 6, the offset into packet 7 for the index associated with the word 'aaron' is located at offset 0, and is 5 bytes long. The index associated with the word 'mulek' can be found at offset 5,000 in packet 7, and is 40 bytes long.

Packet 8 is a bitmap of deleted items (or documents). Packet 8 grows as incremental merges are processed. For each item which is determined to be deleted during an incremental merge, a bit in packet 8 is turned on. The bit refers to that particular item entry in packet 4. For example, if during an incremental merge it is determined that the 20th item listed in packet 4 has been deleted, the 20th bit located in packet 8 is set to 1. This information is used to mask out (i.e., not return them to a user) the granules in an index which are located in deleted items. Thus, during incremental merges of the index maintained in Table 3, references to deleted items and former versions of modified items continue to exist, and over time take up more and more space. The compression method according to this invention can be utilized to remove the index references pointing to granules in deleted items (or former versions of modified items), and the item entries in packet 4 relating to deleted items, and the words in packet 6 which no longer exist in any indexed item.

Index Merge and Update

As documents change, the integrity of the index must be maintained by updating it to reflect the changes. Likewise, if the amount of computer memory is insufficient to permit the creation of one large index, many small indexes can be created and then merged into the final large index.

As it would be inefficient to re-create an entire index each time an indexed document is modified or new documents are added, a merge method for quickly and efficiently updating the existing full text index ("Incremental Merge") is also disclosed. Similarly, a merge method is provided for computers with insufficient memory to hold a single large index ("Low Memory Merge"). This is accomplished generally by first creating a separate index for the new documents and then merging it with the existing index. For the Incremental Merge, a separate list of deleted documents is also maintained so that references to deleted documents may be removed from the index or ignored on retrieval.

The merge is performed in three main steps. First, the Alpha Lists for the indexes are merged together in alphabetical order to form a new Temporary Alpha List. Then the compressed indexes from each index are merged together. Also, the temporary alpha list is compressed and a new high-level index into the compressed alpha list is created. Finally, the directories, files and granule cross-reference list for each index are merged together. If the delete list needs to be used upon retrieval, it will be appended to the end of the completed index. The following is a summary of the method for merging two indexes:

1. Open temporary files for the merge.
2. Get index information for both indexes.
3. Merge the Alpha Lists into a temporary alpha list.
4. Merge the compressed indexes-compress the Temporary Alpha List to make a new compressed Alpha List and make a new index into the compressed Alpha List.
5. Merge the directory, file, and granule lists. If it is an INCREMENTAL MERGE of an existing index, mark the deleted documents in the granule list and use the delete list to remove references to documents that have been deleted or store the delete list with the index or ignore during retrieval of the index.

6. Write the final merged index to a permanent file.

7. Append optional delete list to index.

Step 4, in which the compressed indexes are merged, is the key step of the merge method. The temporary alpha list is traversed sequentially, word by word. If the word is in either the first or second index, but not both, the information in the index entry for the word is copied to the new index. If the word is in both indexes, the index information for the word in the two indexes must first be concatenated into a single entry.

The difficulty of concatenating two index entries for a single word arises in merging the compressed word reference lists when they are in compressed bitstring format. (The two compressed index entries to be concatenated will be referred to hereinafter as index stream 1 and index stream 2). The problem arises when the last code in index stream 1 is in bitstring format and all the positions in the compressed bitstring are not used, i.e., there are more bits available than granules to be encoded. For example, Table 4 shows a one byte encoded bitstring in which only 3 granules are indexed.

TABLE 4

| Bit String Code | Document Number | | | | |
| --- | --- | --- | --- | --- | --- |
| | 1 | 2 | 3 | 4 | 5 |
| 0 1 1 | 1 | 0 | 1 | 0 | 0 |

Since the minimum bitstring size is one byte (8 bits), of which the first 3 bits comprise the code indicating that a bitstring representation follows, and only 3 bits are used to represent the 3 granules, there are 2 unused bits in the bitstring code. In Table 4, the indexed word is found in granules 1 and 3. Thus, the 4th bit (representing document 1) is '1', the 5th bit (representing document 2) is '0', and the 6th bit is '1'. The last 2 bits are not used and are filled with '0's. These extra bits are referred to herein as "overhang".

In order to concatenate index stream 2 into this index, it is necessary to eliminate the overhang and begin at the first unused bit (the 7th bit). Otherwise, the 2 unused bits in the bitstring will be taken to represent the next 2 granules in the new list, which will make the index inaccurate (by causing all granules represented in the index stream to be shifted 2 positions). One method to correct the problem would be to modify the 2 previously unused bits to reflect the second index (i.e., placing a '1' in each of the 2 bits representing a granule in which the word occurs as coded in index stream 2). However, this method is not viable because index stream 2 is in compressed form and the entire index stream would have to be decompressed and recoded to reflect the shift, an inefficient option. The present invention overcomes this problem with a "negative jump" byte.

The negative jump byte contains a value that reflects the size of the overhang in the last byte of index stream 1. It is placed between index streams 1 and 2, thereby enabling index stream 2 to be efficiently concatenated to it without altering the compressed form of either index stream. Thus, when the compressed concatenated index is later decoded back to a bitstring for retrieval, a counter keeps track of the current position (i.e., granule number) in the decoded bitstring. When the decoder encounters a negative jump byte, the counter is decremented by the amount indicated in the negative jump byte. This allows the decoder to re-adjust to the correct granule number. For example, after decoding the bitstring shown in Table 4, the counter would have a value of 6. It would then encounter the negative jump byte with a value of 2 (or greater, see below), indicating that there are 2 overhang bits in the previous bitstring. The counter would then be reset to its correct value of 4 and continue creating the decoded bitstring, beginning in the 4th position. It must also be noted that when index stream 2 is created, it must be shifted "n" bits, where "n" is the number of granules (e.g., if index stream 1 has 2 granules, index stream 2 must be created to start marking at granule 3).

The negative jump byte can be indicated in the "Control Op Code" (the first 4 bits). Although any value could be assigned to the Control Op Code, '1011' is used in the preferred embodiment. The next bit is set to '1', which signifies a negative jump, and the last three bits represent the size of the jump, as shown in Table 5:

TABLE 5

| Code | Negative Jump Size |
| --- | --- |
| 000 | 1 |
| 001 | 2 |
| 010 | 3 |
| 011 | 4 |
| 100 | 5 |
| 101 | 6 |
| 110 | 7 |
| 111 | 8 |

The largest possible negative jump needed is 8.

If a negative jump byte is used, it is also necessary that the first code of index stream 2 be a delta or an absolute element reference. This is because the code needs to be reset to represent the next granule number in sequence after the last granule number in index stream 1 and that can only be done with delta or absolute element reference. For example, if index stream 1 has only 2 possible "hits" with only one "hit" in the last position (01), it would be encoded as a delta 2. Suppose index stream 2 has only one possible "hit" and it has a "hit" at that position (1). Because index stream 2 is shifted 2 positions, it is encoded as a delta 3. Thus, when these two index streams are concatenated, the delta 3 of index stream 2 must be modified to a delta 1 so that is decoded accurately.

There are two possible cases that may be encountered in concatenating index streams where the last byte is in compressed bitstring format. First, when the last encoded bit of index stream 1 ends before the first "hit" of index stream 2, concatenation is accomplished by adjusting the first code (delta or absolute element reference) of index stream 2 to the correct value according to the last "hit" in index stream 1. In this case, a negative jump byte is not necessary because the first code in index stream 2 can be adjusted to account for the overhang. For example, in the example in Table 4, if the first "hit" in index stream 2 occurs in the sixth granule, a negative jump byte would not be necessary. The first code in index stream 2, a delta code, would be adjusted from 6 (indicating the indexed word did not occur until the sixth granule) to 1. It then takes only a delta 1 to get to the 6th position. The bitstring takes 5 positions, so a delta 1 moves the counter to the 6th position. The remaining codes of index stream 2 are then concatenated without alteration to form the new index stream. (The equation used to calculate the negative jump (below) is also used to calculate the new delta value or absolute element reference (if it will not fit in a delta). That is, the value used is the absolute value of the result of the equation.)

The second case, the overlap case, exists when the last encoded bit of index stream 1 ends after or on the first "hit" of index stream 2. A negative jump byte is required only in the overlap case because one or more of the overhang bits in index stream 1 would otherwise be incorrect (i.e., would contain a '0' where it should contain a '1'). The size of the negative jump code (which is encoded as one less than the actual negative jump size) is calculated by the following equation:

Overhang+(LastHit(of Index Stream 1)–FirstHit(of Index Stream 2))

The overhang is equal to the number of O's following the last '1' in the encoded bitstring that is the last byte of index stream 1, e.g., the overhang would be '2' in Table 4. The "LastHit" is equal to the granule number of the last occurrence of the indexed word in index stream 1, i.e., the position of the last '1'. The "FirstHit" is equal to the granule number of the first occurrence of the indexed word in index stream 2, i.e., the position of the first '1'. The negative jump byte is then placed after the last byte in index stream 1 and the first code in index stream 2 is replaced by a delta code with a value of '1'. Finally, the remainder of index stream 2 is then copied to the new index stream.

Step 4 is detailed in the following pseudocode:
1. While there are more index words in the temporary alpha list, get the next word, otherwise go to 2
   1.1 If the word is only in index 1 then
      1.1.1 Write the index entry for the word in index 1 to the new index
      1.1.2 Write the word to the new compressed alphabetical word list in the new index
      1.1.3. If the word needs to be placed in the new high level index to the Alpha List (see Phase IID), put it in.
   1.2 If the word is only in index 2 then
      1.2.1. Write the index entry for the word in index 2 to the new index
      1.2.2. Write the word to the new compressed alphabetical word list in the new index
      1.2.3. If the word needs to be placed in the new high level index to the Alpha List (see Phase IID), put it in.
   1.3 If the word is in both index 1 and index 2 then
      1.3.1 Do MERGEINDEX (below)
      1.3.2. Write the word to the new compressed alphabetical word list in the new index
      1.3.3 If the word needs to be placed in the new high level index to the Alpha List (see Phase IID), put it in.
   1.4 Go to 1
2. Done

MERGEINDEX

1. While writing the index piece for the word from index 1 ("index stream 1") to the new index stream
   1.1. Get the LastHit
   1.2 Also get the Overhang
2. Get the firsthit from the index piece for the word in index 2 ("index stream 2")
3. Granulespace=LastHit-FirstHit
4. Granuleover=Granulespace+Overhang
5. If Granuleover<0 (the index streams do not overlap)
   5.1. Newdelta=-1* Granuleover (for first code in index stream 2)
   5.2. If newdelta<64
      5.2.1. Encode newdelta as a 1 byte delta and write it out to the new index stream
      5.2.2. Copy the rest of index stream 2, except the first code, out to the new index stream
   5.3. If newdelta<4096 and newdelta>63
      5.3.1. Encode the newdelta as a 2 byte delta and write it out to the new index stream
      5.3.2. Copy the rest of index stream 2, except the first code, out to the new index stream
   5.4. If newdelta>4095
      5.4.1. Write out the first code of index stream 2 as is (absolute code), to the new index stream
      5.4.2. Copy the rest of index stream 2 out to the new index stream
6. If(Granuleover>-1) && (Granulespace<1) (The index streams overlap) then
   6.1. NegativeJump=Overhang+Granulespace
   6.2. Encode the negative jump into the control op code
   6.3. Write out the negative jump control op code to the new index stream
   6.4. Write out a 1 byte delta 1 to the new index stream
   6.5 Copy everything after the first code in index stream 2 to the new index stream.

2. THE COMPRESSION SYSTEM

Although the method according to this invention will be described in detail below with respect to the index structure shown in Table 3, it is apparent that the compression method and system according to this invention could be utilized with many types of indexing systems. It is also apparent that the packet numbering in Table 3 is arbitrary, for example packet 3 of Table 3 could comprise the item list rather than the group list. Further, the example given herein refers only to the structure of the index set forth in Table 3, not the actual data within the index. For example, the example given herein does not include the word 'aaron' as shown in packet 6 of Table 3.

The following pseudocode describes in detail the main processing steps of the index compression system and method according to one embodiment of this invention. References to packets refer to equivalent packet structures shown in Table 3.

1. Group/Item/Granule renumbering module
   a. Open files, get delete list (packet 8)
   b. Traverse group/item lists (packets 3 and 4) group by group creating new group/item list plus the item portion of the item/granule remap table (described with reference to Table 6 below).
   c. Traverse old granule cross reference packet (packet 5) plus the old item list (packet 4)to create the granule portion of the item/granule remap table (Table 7).
   d. Sort the item/granule remap table to allow for traversal in ascending order for the new granule numbers in each text index (See Table 9 below).
   e. Traverse the old granule cross reference packet using the item/granule remap table and the new item list to make the new granule cross reference packet.
2. Process each granule index (word reference list) in the full text index (packet 7).
   a. Set the pointers associated with the New Granule Pointers to null. Process each reference in the granule index.
   b. For each reference (references of a granule index are granule numbers), remap to the new granule number and set the New Granule Pointer for that Remap Table Row to the new granule number, or, if the New Granule Pointer for that row already points to a granule number, set the last granule number pointed to by that New Granule Pointer to point to the new granule number.

c. Traverse the remap table in the new sorted order and form a new granule index for that word if remapped granule numerals exist. Can compress the index using a variety of compression strategies.

d. Write out the new index and the new word if a remapped granule index exists after step 2c above. If no remapped granule index for this word exists, do not add the word to the new index maintained in packet 6.

3. Reassemble the new groups/items/granules plus words and full text index references into a new compressed index without a delete list.

The index compression system and method (sometimes referred to as a 'squeeze' operation) according to this invention will now be described with respect to the structure of the index described in Table 3. The method according to this invention can use the bitmap of deleted documents (packet 8) to determine which item entries in packet 4 refer to items which have been deleted. The group (packet 3) and item (packet 4)lists are traversed and a new group/item list is created. For example, after one or more incremental merges, the item list of packet 4 may exist as set forth in columns 1, 2 and 3 of Table 6 below.

TABLE 6

| COL. 1 GROUP REFERENCE | COL. 2 ITEM NAME | COL. 3 ITEM NUMBER | COL. 4 DELETED | COL. 5 REMAP TABLE ROW |
|---|---|---|---|---|
| \TEST3\ | ITEM4 | 1 |  | 1 |
|  | ITEM5 | 2 |  | 1 |
|  | ITEM6 | 3 |  | 1 |
|  | ITEM7 | 4 |  | 1 |
|  | ITEM8 | 5 | YES | 2 |
|  | ITEM9 | 6 |  | 3 |
|  | ITEM10 | 7 | YES | 4 |
| \TEST1\ | ITEM1 | 8 |  | 5 |
|  | ITEM2 | 9 |  | 5 |
|  | ITEM3 ----\| | 10 |  | 5 |
| \TEST4\ | ITEM11 \| | 11 |  | 7 |
|  | ITEM12 \| | 12 |  | 7 |
| \TEST1\ | ITEM13 <- | 13 |  | 6 |

Column 1 of Table 6 is a reference to the groups of packet 3, and shows the group to which a particular item belongs. For example, item numbers 1–7 belong to group \TEST3\, while item numbers 8, 9, 10 and 13 belong to group \TEST1\. Each item number is an index (one-based) into packet 4 of the item entry which refers to the particular item. In this example, a group is equivalent to a file directory.

Column 2 is a list of the item names of packet 4, in the order in which they were entered into packet 4. Column 3 is a list of item numbers, which reflects the position of the item entries within packet 4. Items associated with the same group can be entered into packet 4 at different times, for example during incremental merges, so that all the items of a particular group are not positioned contiguously. For example, both item number 10 and item number 13 belong to group \TEST1\, however item number 11 and item number 12 from group \TEST4\ are positioned between item numbers 10 and 13. The Remap Table Row (column 5) of Table 6 will be described below. The compression method according to this invention utilizes the delete list from packet 8 to recognize that item number 5 and item number 7 have been deleted, as shown in Column 4.

The compression method according to this invention utilizes a Remap Table to create a new index which does not contain references to deleted items. According to one embodiment of this invention, the Remap Table comprises the following description:

1. Delete flag
2. Low item number for this group
3. High item number for this group
4. New low item number to remap to
5. Low granule number for this group
6. High granule number for this group
7. New low granule number to remap to
8. Granule delta (low granule—new low granule) for speed
9. Item offset An example of a Remap Table is shown below in Table 7, and will be used to describe the compression method according to one embodiment of this invention.

TABLE 7

REMAP TABLE

| REMAP TABLE ROW | DELETE FLAG | ITEM | | | | GRANULE | | | |
|---|---|---|---|---|---|---|---|---|---|
| | | LOW | HIGH | NEW LOW | ITEM OFFSET | LOW | HIGH | NEW LOW | GRANULE DELTA |
| 1 | 0 | 1 | 4 | 1 | 0 | 1 | 4 | 1 | 0 |
| 2 | 1 | 5 | 5 | 0 | 0 | 5 | 5 | 0 | 0 |
| 3 | 0 | 6 | 6 | 5 | 9C | 6 | 6 | 5 | −1 |
| 4 | 1 | 7 | 7 | 0 | 0 | 7 | 7 | 0 | 0 |
| 5 | 0 | 8 | 10 | 6 | C3 | 8 | 10 | 6 | −2 |
| 6 | 0 | 13 | 13 | 9 | 138 | 13 | 13 | 9 | −4 |
| 7 | 0 | 11 | 12 | 10 | 160 | 11 | 12 | 10 | −1 |

The method according to this invention creates the 'item' portion of the Remap Table as shown above in Table 7. Each row of the Remap Table reflects a grouping of contiguous nondeleted items or contiguous deleted items which exist within the same group of packet 3. For example, remap table row 1 includes item numbers 1–4 because item numbers 1–4 are contiguous and are all nondeleted, and all belong to group \TEST3\, as shown in Table 6. Remap table row 2 includes only item number 5 because item number 5 has been deleted, and is positioned between item number 4 and item number 6, both of which are nondeleted. Remap table row 3 exists solely of item number 6, because item number 6 has not been deleted, and exists between item number 5 and item number 7, both of which have been deleted. Likewise, remap table row 4 includes only item number 7. Remap table row 5 includes only item numbers 8–10, rather than item numbers 8–13 because item numbers 8–10 exist within group \TEST1\, while item number 11 and item number 12 exist within group \TEST4\. Because item number 13 belongs to group \TEST1\, but is positioned apart from item numbers 8–10, remap table row 6 includes only item number 13. By placing item number 13 in remap table row 6 directly after remap table row 5, item number 13 will ultimately, as described in more detail below, be positioned adjacent item number 10 so that all items within the same group of packet 3 will be positioned together after the compression method according to this invention completes. Remap table row 7 includes item numbers 11 and 12. Column 5 of Table 6 reflects the remap table row number of each item in packet 4.

Referring again to Table 7, the Delete Flag column reflects which remap table rows contain deleted items. The Low column refers to the lowest original item number of any item within the particular row, and the High column refers to the highest original item number of any item in the row. By 'original' it is meant that these item numbers reflect the item numbers as they existed in the index before the compression method of this invention was initiated. The New Low column reflects the new lowest item number of any item in this row after the compression process is completed. The Item Offset column reflects the offset into packet 4 of the lowest item number in that particular row after the compression process is completed.

For example, with respect to remap table row 1, the delete flag is not set because this row does not reflect a row of deleted items. The Low column contains a 1 and the High column contains a 4, which means that the item numbers reflected in remap table row 1 were originally numbered items 1 through 4. The New Low column contains a 1, which means that the item numbers of the items reflected in remap table row 1 will not change. The Item Offset column contains a 0 because the offset into packet 4 of item number 1, after the compression process is completed, will be 0.

With respect to remap table row 2, the delete flag is set since item number 5 is marked to be deleted (see Table 6). The low and high values reflect that only one item is reflected in this remap row, and the new low and item offset values are zero because original item number 5 will be removed after the compression process.

With respect to remap table row 3, the delete flag is not set because remap table row 3 contains item number 6 which has not been deleted. The low and high values reflect that item number 6 is the only item within this remap table row. The New Low column has a value of 5 because after the compression algorithm completes, item number 6 will become item number 5 since the current item number 5 is set to be deleted. The Item Offset value of item number 6 will be 9C in packet 4 after the compression algorithm has completed. With respect to remap table row 4, the delete flag is set because item number 7 has been deleted. The low, high, new low and item offset values are set accordingly. With respect to remap table row 5, the delete flag is not set, the Low column reflects that item number 8 is the lowest item number within this remap table row, and the High column value reflects that item number 10 is the highest item number within this remap table row. The New Low column reflects that after the compression method has completed, item number 8 will become item number 6 since two items that were previously positioned before item number 8 will have been removed. The Item Offset column indicates that the new offset within packet 4 of item number 8 will be C3.

Remap table row 6 indicates that the items reflected in this row are not set to be deleted. The Low and High column values indicate that item number 13 is the only item number within this group. The New Low column reflects that after the compression method is finished, item number 13 will become item number 9. It is relevant to note that in this manner, original item numbers 8, 9 and 10, after the compression method of this invention is completed, will be positioned adjacent original item number 13. This is done to position all items within the same group together. The Item Offset value indicates that the new item number 9 will be at offset 138 within packet 4.

With respect to remap table row 7 the delete flag is not set. The Low column reflects that the lowest item number within this row is item number 11 and the High column reflects that the highest item number reflected in this row is item number 12 . The New Low column indicates that the new item number for original item number 11 will be 10. In other words, original item number 11 will become item number 10 and original item number 12 will become item number 11 after the compression method according to this invention completes. The item offset within the new packet 4 for item number 10 will be 160.

After determining the values for the Item portion of the Remap Table, the values of the Granule portion of the Remap Table are determined. Packet 5 of Table 3 contains the original granule cross reference information. The granule cross reference information is used to translate a granule number to a particular location. Packet 5 contains a list of granules, and the location of each particular granule within a particular item (packet 4). Because the example discussed herein is indexed at the item level granularity, each granule actually refers to an item, and each reference in packet 5 points to an item entry in packet 4. However, if the granularity of this example was of a smaller unit than an item, for example, a paragraph, packet 5 would not only refer to a particular item within packet 4, but would also include an offset within the particular item of the paragraph to which the granule refers. Each granule entry in packet 5 can also contain an item offset entry which indicates the byte offset of the position within packet 4 of the item associated with a particular granule. This allows the implementation of variable length records in packet 4.

As noted earlier, the example discussed herein assumes item level granularity. Thus, the granule numbers shown in the granule portion of the Remap Table as shown in Table 7 reflect item numbers because granularity is at the item level. With reference to remap table row 1, the New Low granule number remains the same number as the original granule number for the granules reflected in this row, since the items associated with these granules will not change their position (as reflected in the Item portion of the Remap Table).

With respect to remap table rows 2 and 4, since each row reflects granules which will be deleted, their original Low and High granule numbers are not changed, and the New Low value is set to zero since the items associated with these granules will no longer exist after the compression method finishes.

With respect to remap table row 3, the original Low granule value and High granule value is 6, and the New Low granule value is 5, since original item (and granule) 5 will be deleted. The Granule Delta value is −1, reflecting the difference between the original Low granule number and the New Low granule number.

Similarly, with respect to remap table row 5, the granule delta value is −2 reflecting the difference between the new Low granule number 6 and the original Low granule number 8.

After the Granule portion of the Remap Table has been completed, the original granule cross reference information (packet 5) is traversed and, utilizing the information in the Granule portion of the Remap Table, a new granule cross reference packet is created, as shown in Table 8a. Table 8b shows how the old granule cross reference table might have appeared.

TABLE 8a

NEW GRANULE
CROSS REFERENCE TABLE

| ITEM NUMBER | NEW OFFSET INTO PACKET 4 |
| --- | --- |
| 1 | 0 |
| 2 | 27 |
| 3 | 4E |
| 4 | 75 |
| 5 | 9C |
| 6 | C3 |
| 7 | EA |
| 8 | 101 |
| 9 | 138 |
| 10 | 160 |
| 11 | 188 |

TABLE 8b

OLD GRANULE
CROSS REFERENCE TABLE

| ITEM NUMBER | OLD OFFSET INTO PACKET 4 |
| --- | --- |
| 1 | 0 |
| 2 | 27 |
| 3 | 4E |
| 4 | 75 |
| 5 | 9C |
| 6 | BC |
| 7 | E3 |
| 8 | 103 |
| 9 | 12A |
| 10 | 141 |
| 11 | 178 |
| 12 | 1A0 |
| 13 | 1C8 |

The compression method according to this invention also recreates a new full text index (packet 7), eliminating the references in each granule index (word reference list) to deleted granules. A Granule Sorted Order List which contains a list of the Remap Table row numbers in an order which translates from the original granule number order to the new granule order number is created.

TABLE 9

GRANULE SORTED ORDER LIST

| GRANULE SORTED ORDER LIST ENTRY | GRANULE SORTED ORDER |
| --- | --- |
| 1 | 1 |
| 2 | 2 |
| 3 | 3 |
| 4 | 4 |
| 5 | 5 |
| 6 | 7 |
| 7 | 6 |

An example of the Granule Sorted Order List is shown in Table 9. By traversing Table 9 in the order of the entries in Table 9, one can access the Remap Table rows such that the granules reflected in the Remap Table rows are accessed in ascending order. The proper order to traverse the granule sorted order list is reflected in the Granule Sorted Order List Entry column.

The compression method according to this invention then begins accessing the original full text index (packet 7) for each word which is indexed. The full text index in packet 7 contains a separate granule index for each unique word that is indexed. The granule index contains an ascending list of granules in which the word exists. The following process described will be performed for each granule index maintained in packet 7. Tables 10–13 will be used to provide an example of this aspect of the compression process according to one embodiment of this invention.

TABLE 10

| REMAP GROUP NUMBER | NEW GRANULE POINTER |
| --- | --- |
| 1 | NULL |
| 2 | NULL |
| 3 | NULL |
| 4 | NULL |
| 5 | NULL |
| 6 | NULL |
| 7 | NULL |

TABLE 11

ORIGINAL
INDEX FOR
WORD 'FOLIAGE'
(FROM PACKET 7)

| |
| --- |
| 1 |
| 3 |
| 4 |
| 5 |
| 11 |
| 12 |
| 13 |

TABLE 12

NEW
GRANULE
POINTER

| |
| --- |
| ->1->3->4 |
| NULL |
| NULL |

TABLE 12-continued

| NEW GRANULE POINTER |
|---|
| NULL |
| NULL |
| ->9 |
| ->10->11 |

TABLE 13

| NEW INDEX FOR WORD 'FOLIAGE' |
|---|
| 1 |
| 3 |
| 4 |
| 9 |
| 10 |
| 11 |

Table 10 includes two columns, each column representing a list. The first column represents the remap table row numbers from the Remap Table Row column of Table 3. The second column represents a pointer structure associated with each remap row. For each granule index in packet 7, the New Granule Pointer reference associated with each row of the Remap Table is set to null, as shown in Table 10. Table 11 is an example of a particular granule index for the word 'foliage' as it might have originally been stored in packet 7. For example, Table 11 shows that the granule index associated with the word 'foliage' in packet 7 initially contained references to granules 1, 3, 4, 5, 11, 12 and 13.

Table 12 reflects how the New Granule Pointer references of Table 11 will change as the granule index for the word 'foliage' is recreated by the compression method of this invention. As stated earlier, and as shown in Table 10, the New Granule Pointer references are initially set to null. The first granule reference in the granule index for the word 'foliage' is accessed. As shown in Table 11, the first entry is to granule 1. The process then begins accessing the Granule Sorted Order List, Table 9, in the proper order, from entry 1 to entry 7, as shown in the Granule Sorted Order List Entry column, to determine in which order the rows of the Remap Table (Table 7) should be accessed in order to access the new granule numbers in ascending order. For example, the first entry in the granule sorted order list is to remap table row 1. Thus, the process according to this invention first accesses remap table row 1 to determine if granule number 1 is remapped in this row. Since granule number 1 falls within the Low granule number and the High granule number of remap row 1, remap row 1 does in fact contain the information for properly remapping original granule 1 to a new granule number. The Granule Delta column of Table 7 contains a value of 0, which means that granule number 1 will remain granule number 1 in the new granule index.

The method according to this invention determines if the New Granule Pointer associated with remap row 1 points to a granule number, or is null. Since this is the first granule in this granule index being remapped, the New Granule Pointer associated with remap row 1 is in fact null. The New Granule Pointer is then changed to point to the numeral 1. The next granule reference in the granule index for the word 'foliage' is then accessed. As shown in Table 11, the next entry is granule number 3. Since granule references in each granule index are preferably maintained in ascending order, and the Granule Sorted Order List maintains a list of the remap table rows in an ascending order of new granule numbers, the method according to this invention can maintain an index into the Granule Sorted Order List and reference the entry of the Granule Sorted Order List which it last utilized, to eliminate accessing Remap Table rows which cannot remap the granule currently being remapped. Since the last Granule Sorted Order List entry accessed was entry 1, remap table row 1 is again accessed to determine if granule 3 is remapped in remap table row 1. The granule portion of remap table row 1 indicates that granule number 3 is remapped in this row. However, the Granule Delta value of 0 indicates that granule number 3 will remain granule number 3 in the new granule index. The method according to this invention then creates a link (or pointer) from the numeral 1 to the numeral 3, as shown in Table 12.

The next granule entry of the granule index is granule number 4, as shown in Table 11. The first entry of the Granule Sorted Order List is accessed, since the index did not change, and thus remap row number 1 is again accessed. It is determined that granule number 4 has not changed. Thus, a link is created from the numeral 3 to the numeral 4, as shown in Table 12.

The next granule entry of the granule index is accessed. As shown in Table 11, the next granule entry is granule number 5. The Granule Sorted Order List is accessed and it is determined that remap row number 1 does not remap granule number 5 because granule number 5 does not fall within the Low and High granule numbers of remap row number 1. The index on the Granule Sorted Order List is incremented by 1, and now equals 2. Thus, the 2nd entry of the Granule Sorted Order List is accessed. The 2nd entry of the Granule Sorted Order List indicates that remap table row number 2 should be accessed next. The method according to this invention determines that the granule portion of remap row number 2 remaps granule number 5, however, since the Delete Flag is set, granule number 5 will be deleted, and the method according to this invention goes to the next granule entry in the granule index for this word.

The next granule entry is granule number 11. The 2nd entry of the Granule Sorted Order List is accessed since entry number 2 is the entry which was last accessed. Thus, by maintaining an index on the Granule Sorted Order List, remap row number 1 was not accessed for this granule entry. Since remap row number 2 does not remap granule number 11, the index on the Granule Sorted Order List is incremented by one, and the third entry of the Granule Sorted Order List is referred to. The third entry in the Granule Sorted Order List refers to remap row number 3. The low and high granule numbers of remap row number 3 indicate that granule number 11 is not remapped in this row. The index on the Granule Sorted Order List is incremented by 1, and the fourth entry of the Granule Sorted Order List is referred to. The fourth entry of the Granule Sorted Order List refers to remap row number 4. The low and high granule values of remap row number 4 indicate that granule number 11 is not remapped in this row. Similarly, entry 5 of the Granule Sorted Order List is accessed and remap row number 5 is accessed. Since remap row number 5 does not remap granule number 11, the index on the Granule Sorted Order List is incremented by 1 to 6. The sixth entry of the Granule Sorted Ordered List refers to remap row number 7. The low and high granule numbers associated with remap row number 7 indicate that granule number 11 is remapped in this row. The Granule Delta associated with remap row number 7 is -1. Thus, a 1 is subtracted from the granule number 11 to derive a new granule number 10. Since the New Granule Pointer associated with remap row number 7 is null, a pointer is set for remap row number 7 pointing to the numeral 10, as shown in Table 12.

The next granule entry of the granule index for the word 'foliage' is accessed. This entry is granule number 12 as shown in Table 11. The index on the Granule Sorted Order List is utilized to access entry number 6 of the Granule Sorted Order List. Entry number 6 of the Granule Sorted Order List refers to remap row number 7. It is determined that remap row number 7 contains the appropriate remapping for granule number 12. Again, the Granule Delta column indicates that a 1 should be subtracted from granule number 12 to derive the new granule number 11. Since there is already a pointer associated with remap row number 7, a link is set to point from the numeral 10 to the numeral 11, as shown in Table 12. The next entry in the granule index for the word 'foliage' is accessed. This is granule number 13. The index is utilized to access the Granule Sorted Order List. The sixth entry of the Granule Sorted Order List points to remap row number 7. The Low and High granule values associated with remap row number 7 indicate that granule number 13 is not remapped in this row. The index associated with the Granule Sorted Order List is incremented by 1 and now equals 7. The seventh entry of the Granule Sorted Order List is accessed, which refers to remap row number 6. The Low and High granule numbers associated with remap row number 6 indicate that granule number 13 is remapped in this row. The Granule Delta value of remap row number 6 indicates that a 4 should be subtracted to remap granule number 13 to granule number 9. Since there is no New Granule Pointer associated with remap row number 6, a pointer is created to point to the numeral 9, as shown in Table 12.

The compression method according to this invention then determines that there are no more granule entries in the granule index of the word 'foliage'. The New Granule Pointer column (Table 12) is then traversed in the order of the remap row numbers from remap row number 1 to remap row number 7 to create a new granule index for the word 'foliage'. For example, the New Granule Pointer associated with remap row number 1 points to the numeral 1, which points to the numeral 3, which points to the numeral 4. Thus, a new granule index is created which contains references to granule numbers 1, 3 and 4. The New Granule Pointers associated with remap row numbers 2–5 are null, and thus ignored. The New Granule Pointer associated with remap row number 6 points to the numeral 9 and thus the numeral 9 is added to the granule index being created. The New Granule Pointer associated with remap row number 7 points to the numeral 10, which in turn points to the numeral 11. Thus, numerals 10 and 11 are added to the granule index associated with the word 'foliage'. As shown in Table 13, the new index for the word 'foliage' now contains granule entries 1, 3, 4, 9, 10 and 11.

As can be seen, the entry in Table 11 referring to granule number 5 which has been deleted no longer exists in the new granule index for this word as shown in Table 13. The new index can then be compressed according to any of the compression methods known to those skilled in the art. After all the granule indexes associated with packet number 7 are recreated and compressed, a new packet 7 can be written to disk. After the compression method according to this invention finishes, packet 8 will be empty because no granule indexes will contain entries to deleted items.

Figure 4:
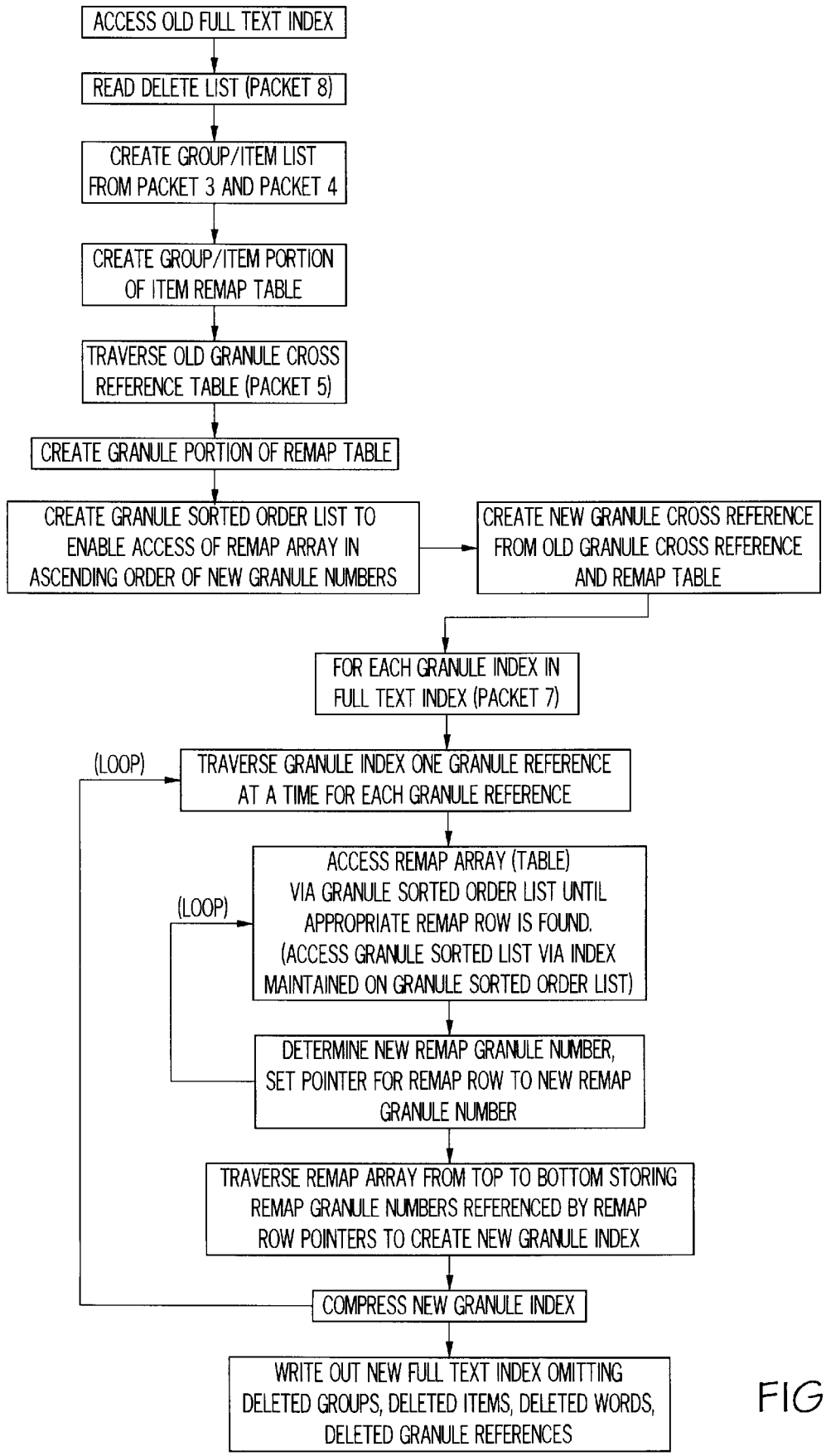
FIG. 4 is a flow diagram illustrating the flow of the compression method and system according to one embodiment of this invention.

FIG. 4 is a flow diagram illustrating the compression method according to one embodiment of the invention.

The index compression method and system for eliminating unused references according to this invention (sometimes referred to as a 'squeeze' process) can be implemented and utilized in a variety of different ways. For example, the compression method according to this invention could be used to compress only an incremental index rather than an original index. According to another embodiment of this invention, an incremental index could first be squeezed, then merged with an original index, and then the merged index could be squeezed. It is apparent that other such variations are within the contemplation of this invention.

Figure 5:
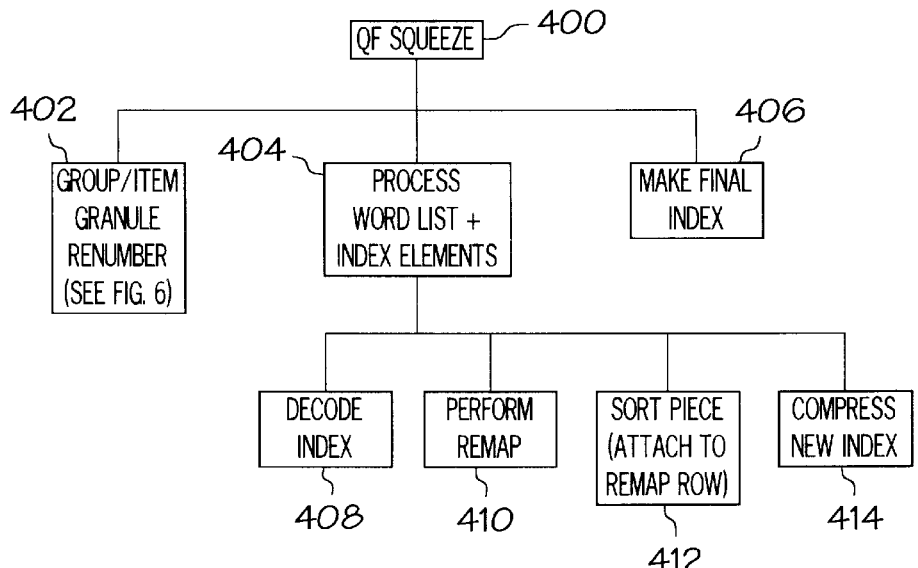
FIG. 5 is a block diagram illustrating a broad overview of a squeeze operation according to one embodiment of this invention.

FIG. 5 is a block diagram showing a general order of processing according to one embodiment of this invention. At block 400, the squeeze process is initiated. At block 402 the remap table (Table 7), the new granule cross-reference table (Table 8a), and the granule sorted order list (Table 9) are created. At block 404, the alphabetical word list (packet 6) is processed and each word reference list in packet 7 is traversed and new word reference lists are created. At block 406, new packets are created which no longer contain references to deleted indexed items. Blocks 408, 410, 412 and 414 illustrate in more detail the process for generating new word reference lists. At block 408, a word reference list is decompressed. At block 410 each reference in the original word reference list which points to a nondeleted indexed item is remapped via the remap table (Table 7). As each word reference list is being processed, a temporary structure containing pointers to the appropriate references is maintained (Table 12). After the original word reference list for a particular word is processed, a new word reference list is generated from the temporary structure. If desired, at block 414, each word reference list can be compressed prior to storing the word reference list on disk.

Figure 6:
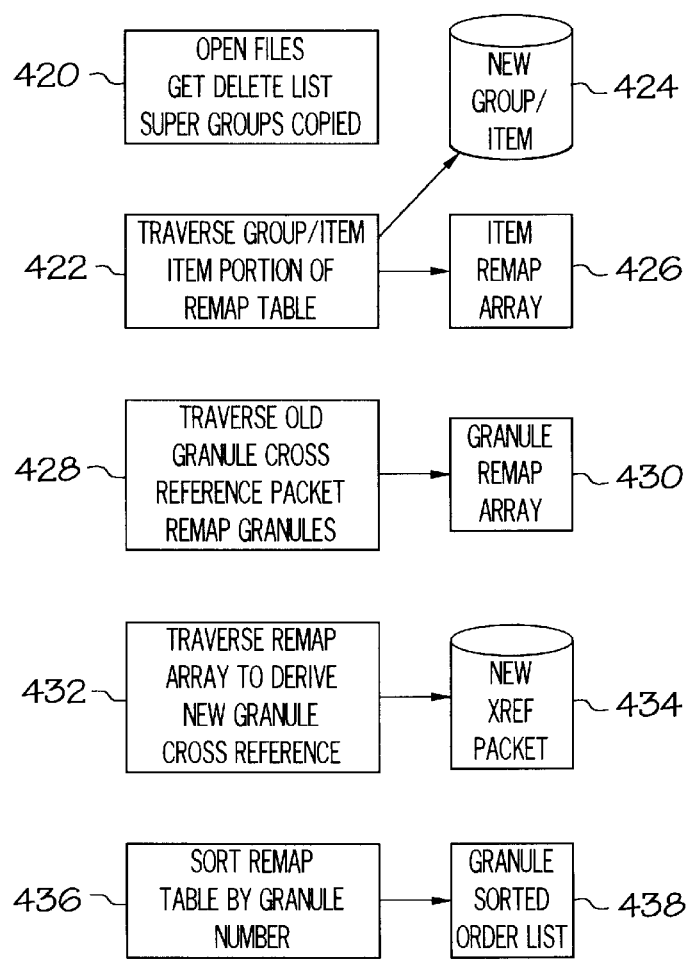
FIG. 6 is a more detailed block diagram of one aspect of the squeeze operation shown in FIG. 5.

FIG. 6 is a block diagram which illustrates the process described at block 402 of FIG. 5 in greater detail. At block 420 of FIG. 6 the files which compose the index are opened and the delete list (packet 8) is obtained. At block 422 the group/items (packets 2 and 3) are traversed and new packets are generated, as shown at block 424. The item portion of the remap table (Table 7) is then generated. At block 428 the old granule cross-reference packet (packet 5) is traversed and the granule remap portion of the remap array (Table 7) is generated. At block 432 the remap table is traversed to derive the new granule cross-reference packet (packet 5). At block 436 the remap table is sorted by granule number to generate the granule sorted order list at block 438 (Table 9).

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principals of the invention and its practical application to thereby enable one of ordinary skill in the art to best utilize the invention in various embodiments and with various modifications as are suited to the particular use contemplated.

I claim:

1. In an index containing a first item list and an indexed word list, the first item list including a plurality of item entries, each item entry having an item index associated therewith, each item entry referring to a deleted or a nondeleted indexed item, wherein at least some of the indexed items comprise a plurality of granules, the index having a first granule cross-reference table including a plurality of granule entries, each granule entry having a granule index associated therewith, and each granule entry referring to an item entry of an indexed item in the first item list, the indexed word list including a plurality of word entries, each word entry associated with a first word reference list, each first word reference list including a reference to an item entry of an indexed item in which the associated word is located, a method for eliminating references to item entries which refer to deleted indexed items, the method comprising:

determining which item entries refer to deleted indexed items;

forming a remap item list which remaps the item entries which refer to nondeleted indexed items from a first item index in the first item list to a second item index in a second item list and which remaps the granule index of granule entries which refer to an item entry of a nondeleted indexed item from a first granule index in the first granule cross-reference table to a second granule index in a second granule cross-reference table;

traversing the indexed word list by
  a) for each word entry, traversing the first word reference list associated with the word entry;
  b) for each reference in the first word reference list determining if the reference refers to an item entry of a nondeleted indexed item or an item entry of a deleted indexed item, and if the item entry refers to a nondeleted indexed item accessing the remap item list to obtain a reference to a second item entry in the second item list which refers to the nondeleted indexed item and storing the reference in a second word reference list;

associating each word entry in the indexed word list which has at least one reference to an item entry which refers to a nondeleted indexed item with the respective second word reference list; and forming the second item list by associating the item entries of the nondeleted items with the respective second item index referred to in the remap item list.

2. In an index according to claim 1, wherein each reference in the second word reference list is an item index of an item entry.

3. In an index according to claim 1, wherein the remap item list further comprises a data field containing data indicating which item entries refer to deleted indexed items.

4. In an index according to claim 1, wherein each reference in the second word reference list is a granule index of a granule entry.

5. In an index according to claim 4, wherein the remap item list comprises a plurality of remap entries, each remap entry remapping a range of one or more contiguous item indexes of item entries and the granule indexes of granule entries associated therewith, a remap entry comprising a nondeleted indexed item remap entry or a deleted indexed item remap entry, each item index in a nondeleted indexed item remap entry referring to an item entry of a nondeleted indexed item, and each item index in a deleted indexed item remap entry referring to an item entry of a deleted indexed item.

6. In an index according to claim 5, wherein each nondeleted indexed item remap entry includes a first low granule field and a first high granule field, the first low granule field containing the lowest granule index of the granule entries in the first granule cross-reference table remapped by the remap entry, the first high granule field containing the highest granule index of the granule entries in the first granule cross-reference table remapped by the remap entry, and a second low granule field, the second low granule field containing the lowest granule index of the granule entries in the second granule cross-reference table remapped by the remap entry.

7. In an index according to claim 6, wherein each nondeleted indexed item remap entry further comprises a granule delta field, and the granule delta field contains a value reflecting a difference between the value of the first low granule field and the value of the second low granule field.

8. In an index according to claim 1, wherein the remap item list comprises a plurality of remap entries, each remap entry remapping a range of one or more contiguous item indexes of item entries, a remap entry comprising a nondeleted indexed item remap entry or a deleted indexed item remap entry, each item index in a nondeleted indexed item remap entry referring to an item entry of a nondeleted indexed item, and each item index in a deleted indexed item remap entry referring to an item entry of a deleted indexed item.

9. In an index according to claim 8, wherein each nondeleted indexed item remap entry comprises a first low item field and a first high item field, the first low item field containing the lowest item index of the item entries in the first item list remapped by the remap entry, the first high item field containing the highest item index of the item entries in the first item list remapped by the remap entry, and a second low item field, the second low item field containing the lowest item index of the item entries in the second item list remapped by the remap entry.

10. In an index according to claim 1, wherein at least one of the first item entries in the first item list has the same value as the corresponding second item entry in the second item list.

11. In an index according to claim 1, further comprising forming a second indexed word list, each word entry in the second indexed word list being associated with a second word reference list having at least one reference which refers to a second item entry in the second item list of a nondeleted indexed item.

12. A system for use in conjunction with an index containing a first item list and an indexed word list, the first item list including a plurality of item entries, each item entry having an item index associated therewith, each item entry referring to a deleted or a nondeleted indexed item, wherein at least some of the indexed items comprise a plurality of granules, the index having a first granule cross-reference table including a plurality of granule entries, each granule entry having a granule index associated therewith, and each granule entry referring to an item entry of an indexed item in the first item list, the indexed word list including a plurality of word entries, each word entry associated with a first word reference list, each first word reference list including a reference to an item entry of an indexed item in which the associated word is located, the system being adapted for eliminating references to items entries which refer to deleted indexed items, the system comprising:

a deleted-item task operative to generate a structure for determining which item entries refer to deleted indexed items;

a remap task operative to generate a remap item list which remaps the item index of item entries which refer to nondeleted indexed items from a first item index in the first item list to a second item index in a second item list;

a word index task operative to traverse the indexed word list by
  a) for each word entry, traversing the first word reference list associated with the word entry; and
  b) for each reference in the first word reference list determining if the reference refers to an item entry of a nondeleted indexed item or a deleted indexed item, and if the item entry refers to a nondeleted indexed item accessing the remap item list to obtain a reference to the second item entry in the second item list which refers to the nondeleted indexed item and storing the reference in a second word reference list, wherein each reference in the second word reference list a granule index of a granule entry;

a task operative to associate each word entry in the indexed word list having at least one reference to an item entry which refers to a nondeleted indexed item with the respective second word reference list; and a task operative to form the second item list by associating the item entries of the nondeleted items with the respective second item index referred to in the remap item list.

13. In an index according to claim 1, wherein the remap item list comprises a plurality of remap entries, each remap entry remapping a range of one or more contiguous item indexes of item entries and the granule indexes of granule entries associated therewith, a remap entry comprising one of a nondeleted indexed item remap entry or a deleted indexed item remap entry, each item index in a nondeleted indexed item remap entry referring to an item entry of a nondeleted indexed item, and each item index in a deleted indexed item remap entry referring to an item entry of a deleted indexed item.

14. In an index according to claim 13, wherein each nondeleted indexed item remap entry includes a first low granule field and a first high granule field, the first low granule field containing the lowest granule index of the granule entries in the first granule cross-reference table remapped by the remap entry, the first high granule field containing the highest granule index of the granule entries in the first granule cross-reference table remapped by the remap entry, and a second low granule field, the second low granule field containing the lowest granule index of the granule entries in the second granule cross-reference table remapped by the remap entry.

15. In an index according to claim 14, wherein each nondeleted indexed item remap entry further comprises a granule delta field, and the granule delta field contains a value reflecting a difference between the value of the first low granule field and the value of the second low granule field.

16. In an index containing a first item list and an indexed word list, the first item list including a plurality of item entries, each item entry having an item index associated therewith, each item entry referring to a deleted or a nondeleted indexed item, wherein at least some of the indexed items comprise a plurality of granules the index having a first granule cross-reference table including a plurality of granule entries, each granule entry having a granule index associated therewith, and each granule entry referring to an item entry of an indexed item in the first item list the indexed word list including a plurality of word entries, each word entry associated with a first word reference list, each first word reference list including a reference to an item entry of an indexed item in which the associated word is located, a computer-readable medium having encoded thereon a method for eliminating references to item entries which refer to deleted indexed items, the method comprising:

determining which item entries refer to deleted indexed items;

forming a remap item list which remaps the item index of item entries which refer to nondeleted indexed items from a first item index in the first item list to a second item index in a second item list;

traversing the indexed word list by
a) for each word entry, traversing the first word reference list associated with the word entry;
b) for each reference in the first word reference list determining if the reference refers to an item entry of one of a nondeleted indexed item and a deleted indexed item, and if the item entry refers to a nondeleted indexed item accessing the remap item list to obtain a reference to a second item entry in the second item list which refers to the nondeleted indexed item and storing the reference to the second item entry in a second word reference list, wherein each reference in the second word reference list is a granule index of granule entry;

associating each word entry in the indexed word list having at least one reference to an item entry which refers to a nondeleted indexed item with the respective second word reference list; and forming the second item list by associating the item entries of the nondeleted items with the respective second item index referred to in the remap item list.

* * * * *